US009904082B2

(12) United States Patent
Lee et al.

(10) Patent No.: US 9,904,082 B2
(45) Date of Patent: Feb. 27, 2018

(54) LIQUID CRYSTAL DISPLAY DEVICE INCLUDING REINFORCING FRAME

(71) Applicant: LG DISPLAY CO., LTD., Seoul (KR)

(72) Inventors: Se-Min Lee, Seoul (KR); Bum-Seok Chung, Goyang-si (KR); Dae-Hun Lee, Yongin-si (KR); Tae-Hyung Kim, Gimpo-si (KR); Hyo-Sung Lee, Jecheon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/811,099

(22) Filed: Jul. 28, 2015

(65) Prior Publication Data

US 2016/0187709 A1    Jun. 30, 2016

(30) Foreign Application Priority Data

Dec. 30, 2014    (KR) .......................... 10-2014-0193044

(51) Int. Cl.
*G02F 1/1333*    (2006.01)
*H05K 1/18*    (2006.01)
*G02F 1/1335*    (2006.01)

(52) U.S. Cl.
CPC .. *G02F 1/133308* (2013.01); *G02F 1/133608* (2013.01); *H05K 1/189* (2013.01); *G02F 2001/133314* (2013.01); *G02F 2001/133328* (2013.01); *H05K 2201/056* (2013.01); *H05K 2201/10128* (2013.01); *H05K 2201/10136* (2013.01)

(58) Field of Classification Search
CPC ......... G02F 1/133308; G02F 1/133608; G02F 2001/133314; G02F 2001/133322; H05K 1/028; H05K 2201/10136
See application file for complete search history.

(56) References Cited

U.S. PATENT DOCUMENTS

| 2007/0047264 | A1* | 3/2007 | Joo | .................... G02F 1/133608 362/633 |
| 2012/0050636 | A1* | 3/2012 | Jeong | ................ G02F 1/133308 349/58 |
| 2014/0009914 | A1* | 1/2014 | Cho | ......................... G09F 9/35 362/97.3 |

(Continued)

FOREIGN PATENT DOCUMENTS

| KR | 10-2008-0011959 A | 2/2008 |
| KR | 10-2012-0021073 A | 3/2012 |
| KR | 10-2014-0059930 A | 5/2014 |

*Primary Examiner* — Ryan Crockett
*Assistant Examiner* — Mariam Qureshi
(74) *Attorney, Agent, or Firm* — Dentons US LLP (57) ABSTRACT

Disclosed is a curved display device that may include a display panel having a curvature between a top frame and a bottom frame; a printed circuit board (PCB) electrically connected to at least one edge portion of the display panel where driving circuits and signal lines are provided through a connector; and a reinforcing frame that supports a rear surface of the bottom frame, the reinforcing frame including a reinforcing bar substantially following the curvature of the display panel, wherein the reinforcing bar has a step to include first and second rear surfaces, with the first rear surface being closer to the display panel than the second rear surface, and wherein the PCB is mounted on the first rear surface of the reinforcing bar.

19 Claims, 7 Drawing Sheets

(56) References Cited

U.S. PATENT DOCUMENTS

| | | | | |
|---|---|---|---|---|
| 2014/0355805 A1* | 12/2014 | Park | ............... | H04N 5/64 |
| | | | | 381/333 |
| 2015/0055316 A1* | 2/2015 | Ye | ............... | G02B 7/00 |
| | | | | 361/809 |
| 2015/0160407 A1* | 6/2015 | Hsiao | ............... | G02F 1/133308 |
| | | | | 349/65 |
| 2016/0085110 A1* | 3/2016 | Shin | ............... | G02F 1/133308 |
| | | | | 349/58 |

* cited by examiner

FIG. 5A bright line

FIG. 9 no bright line with higher luminance

LIQUID CRYSTAL DISPLAY DEVICE INCLUDING REINFORCING FRAME

This application claims the benefit of Korean Patent Application No. 10-2014-0193044, filed on Dec. 30, 2014, which is hereby incorporated by reference for all purposes as if fully set forth herein.

BACKGROUND OF THE INVENTION

Field of the Invention

The present invention relates to a display device, and more particularly, to a liquid crystal display device including a reinforcing frame.

Discussion of the Related Art

Recently, as the information society progresses, display devices processing and displaying a large amount of information have rapidly advanced and various flat panel displays (FPDs) have been developed. Specifically, the FPDs such as liquid crystal display (LCD) devices, plasma display panel (PDP) devices, organic light emitting diode (OLED) display devices and field emission display (FED) devices, which have superior characteristics such as thin profile, light weight and low power consumption, have replaced cathode ray tubes (CRT).

Among various FPDs, LCD devices, which have various advantages of high contrast ratio, displaying moving images and low power consumption, have been used in various fields such as notebooks, monitors and televisions. LCD devices take advantage of the optical anisotropy and polarization properties of liquid crystal molecules.

An LCD device includes a liquid crystal panel having two substrates facing each other, with a liquid crystal layer between the two substrates, and obtains difference in transmittance by changing an alignment direction of the liquid crystal molecules with an electric field in the liquid crystal panel.

A curved LCD device has been the subject of more recent research and development. A user may be immersed and feel comport watching more realistic images of the curved LCD device.

Figure 1:
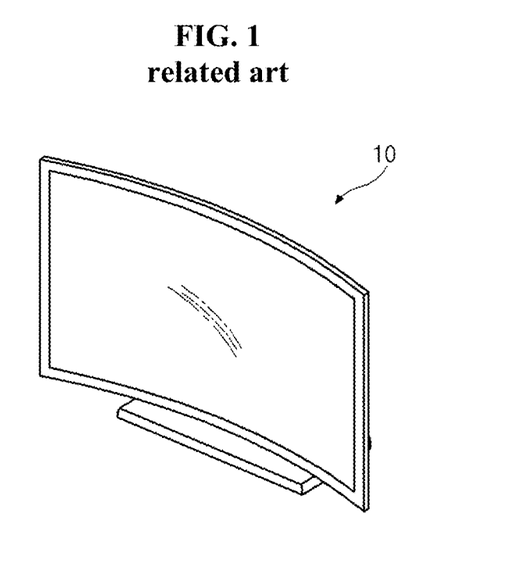
FIG. 1 is a perspective view showing a curved liquid crystal display device according to the related art.

FIG. 1 is a perspective view showing a curved liquid crystal display device according to the related art.

In FIG. 1, since a curved liquid crystal display (LCD) device 10 is a non-emissive type display device, it requires an additional light source to display an image with difference in transmittance. Accordingly, a backlight unit including a light source is disposed over a rear surface of a liquid crystal panel.

The backlight unit may be classified into a direct type and an edge type according to an arrangement structure of the light source. The direct type backlight unit has a structure in which a plurality of light sources are disposed under the liquid crystal panel, and the edge type backlight unit has a structure in which a single light source or a pair of light sources are disposed at a side or both sides of a light guide plate. The direct type backlight unit, which typically has a greater thickness as compared with the edge type backlight unit, may be used for an LCD device such as a large-sized television, where brightness is more important than thickness. On the other hand, the edge type backlight unit, which typically has lighter weight and thinner profile as compared with the direct type, may be used for an LCD device such as a monitor for a notebook computer or a personal computer, where thickness is more important than brightness.

In the curved LCD device 10, a printed circuit board (PCB) connected to a front edge surface of the liquid crystal panel through a connecting member contacts a rear surface of the curved LCD device 10 by folding the connecting member. Since the curved LCD device 10 typically have different thicknesses depending on the type of the backlight unit such as the direct type or the edge type, the connecting member, through which the PCB can contact the rear surface of the curved LCD device 10, need to have different lengths, which may increase the cost of the connecting member and decrease fabrication efficiency.

SUMMARY OF THE INVENTION

Accordingly, the present invention is directed to a display device including a reinforcing frame and method for manufacturing the same that substantially obviates one or more of the problems due to limitations and disadvantages of the related art.

An advantage of the present invention is to provide a curved liquid crystal display device including a backlight unit that is capable of reducing fabrication cost and efficiency.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a curved display device may, for example, include a display panel having a curvature between a top frame and a bottom frame; a printed circuit board (PCB) electrically connected to at least one edge portion of the display panel where driving circuits and signal lines are provided through a connector; and a reinforcing frame that supports a rear surface of the bottom frame, the reinforcing frame including a reinforcing bar substantially following the curvature of the display panel, wherein the reinforcing bar has a step to include first and second rear surfaces, with the first rear surface being closer to the display panel than the second rear surface, and wherein the PCB is mounted on the first rear surface of the reinforcing bar.

In another aspect of the present invention, a liquid crystal display (LCD) module may, for example, include an LCD panel between a top frame and a bottom frame; a printed circuit board (PCB) electrically connected to a plurality of driving ICs of the LCD panel through a foldable connector; and a pair of reinforcing bars spaced apart from each other, disposed along a longitudinal direction of the bottom frame and supporting a rear surface of the bottom frame, wherein at least one of the pair of reinforcing bars has a step to include first and second rear surfaces, with the first rear surface being closer to the LCD panel than the second rear surface, and wherein the PCB is mounted on the first rear surface of the at least one of the pair of reinforcing bars.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the present invention, examples of which are illustrated in the accompanying drawings. The same reference numbers may be used throughout the drawings to refer to the same or like parts.

Figure 2:
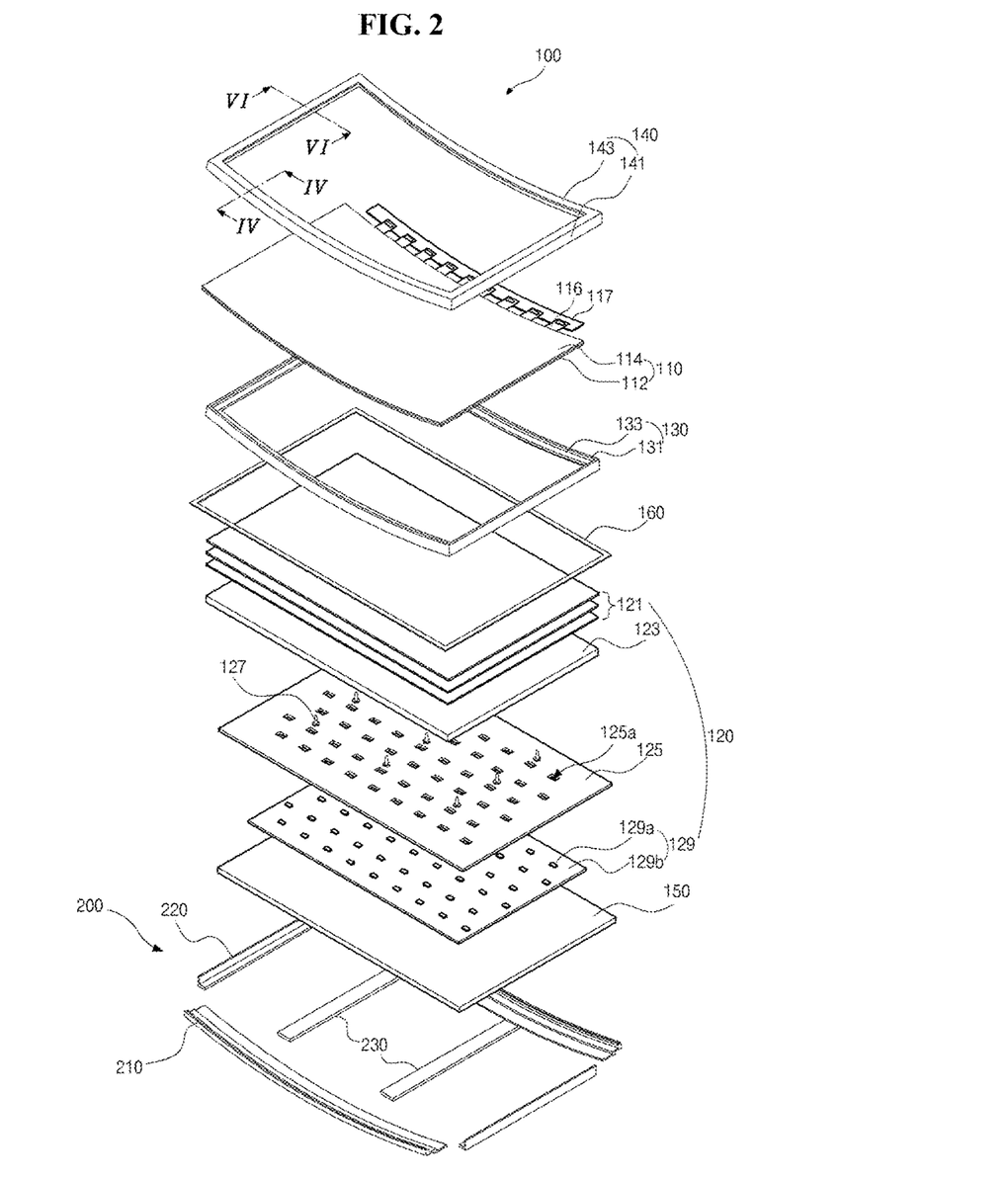
FIG. 2 is an exploded perspective view illustrating a curved liquid crystal display device according to one embodiment of the present invention.

FIG. 2 is an exploded perspective view illustrating a curved liquid crystal display device according to one embodiment of the present invention.

In FIG. 2, a curved liquid crystal display (LCD) device 100 includes a liquid crystal panel 110, a backlight unit 120, a main frame 130, a top frame 140, a bottom frame 150, an optical guide frame 160 and a reinforcing frame 200.

The liquid crystal panel 110 displays an image toward an upper direction. The optical guide frame 160 surrounding a front edge surface of the backlight unit 120 is disposed under the liquid crystal panel 110. The main frame 130 having a rectangular ring shape surrounds a side surface of the optical guide frame 160 and the backlight unit 120. The top frame 140 surrounds a side surface of the liquid crystal panel 110 and the main frame 130. The top frame 140 covers a front edge surface of the liquid crystal panel 110. The bottom frame 150 covers a rear surface of the backlight unit 120. The main frame 130, the top frame 140 and the bottom frame 150 are combined with each other to modularize the liquid crystal panel 110 and the backlight unit 120. The reinforcing fame 200 is disposed under a rear surface of the bottom frame 150 to support a whole rear surface of the curved LCD device 100.

The liquid crystal panel 110 includes first and second substrates 112 and 114 facing and spaced apart from each other and a liquid crystal layer (not shown) between the first and second substrates 112 and 114. The first substrate 112 may be referred to as a lower substrate or array substrate, and the second substrate 114 may be referred to as an upper substrate or color filter substrate.

Although not shown, when the liquid crystal panel 110 is an active matrix type, a plurality of gate lines, a plurality of data lines, a plurality of thin film transistors (TFTs) and a plurality of pixel electrodes may be formed on an inner surface of the first substrate 112. The plurality of gate lines and the plurality of data lines may cross each other to define a plurality of pixel regions, and the pixel electrode in each pixel region may be connected to the TFT connected to the gate line and the data line. In addition, a color filter layer including red, green and blue color filters, a black matrix and a common electrode may be formed on an inner surface of the second substrate 114. Each color filter may correspond to the pixel region, and the black matrix may correspond to the gate line, the data line and the TFT. The common electrode may cover the color filter layer and the black matrix.

Printed circuit board (PCB) 117 is connected to at least one edge portion of the liquid crystal panel 110 where driving circuits and signal lines are provided through a connecting member 116 such as a flexible printed circuit (FPC). The PCB 117 may contact a rear surface of the reinforcing frame 200 by folding the connecting member 116 during a modularization process.

Although not shown, upper and lower alignment layers may be formed on the inner surfaces of the first and second substrates 112 and 114, respectively, and a seal pattern may be formed at the edge portions between the first and second substrates 112 and 114. In addition, upper and lower polarizing plates 119a and 119b (of FIG. 4) are formed on outer surfaces of the first and second substrates 112 and 114, respectively. The liquid crystal panel 110 has a predetermined curvature. For example, the liquid crystal panel 110 may have a concave shape toward the front direction.

The backlight unit 120 supplies light to the liquid crystal panel 110 so that an image based on difference in transmittance of the liquid crystal layer can be displayed. The backlight unit 120 includes a light emitting diode (LED) assembly 129, a reflecting plate 125, a diffusing plate 123 and optical sheets 121.

The LED assembly 129 disposed under the rear surface of the liquid crystal panel 110 functions as a light source of the backlight unit 120. The LED assembly 129 includes an LED printed circuit board (PCB) 129b on an inner surface of the bottom frame 150 and a plurality of LEDs 129a mounted on the LED PCB 129b. For improving emission efficiency and luminance, the plurality of LEDs 129a may include a blue LED having a yellow fluorescent material. For example, the yellow fluorescent material may include yttrium aluminum garnet doped with cerium (YAG:Ce). A blue light emitted from the blue LED may pass through the yellow fluorescent material and may be mixed with a yellow light emitted from the yellow fluorescent material such that the blue LED having the yellow fluorescent material emits a white light.

The reflecting plate 125 has a plurality of through holes 125a corresponding to the plurality of LEDs 129a. The plurality of LEDs 129a pass through the plurality of through holes 125a so that the reflecting plate 125 covers the LED PCB 129b and the bottom frame 150 except the plurality of LEDs 129a. Since the light travelling toward a rear portion of the LEDs 129a is reflected on the reflecting plate 125 toward the diffusing plate 123, the luminance and light efficiency of the backlight unit 120 can be increased.

The diffusing plate 123 and the optical sheets 121 are disposed over and spaced apart from the LED assembly 129 by a guide supporter 127. The diffusing plate 123 and the optical sheets 121 improve luminance uniformity of the light emitted from the plurality of LEDs 129a. The diffusing plate 123 and the optical sheets 121 are supported by the guide supporter 127 so that sagging of the diffusing plate 123 and the optical sheets 121 can be reduced or prevented. The optical sheets 121 may include a diffusing sheet and at least one collimating sheet. The optical sheets 121 may diffuse or collimate the light passing through the diffusing plate 123 so that more uniform surface light can be incident on the liquid crystal panel 110.

As a result, the light emitted from the plurality of LEDs 129a of the LED assembly 129 is processed as a uniform light of high quality while passing through the diffusing plate 123 and the optical sheets 121 and enters the liquid crystal panel 110. The liquid crystal panel 110 can display an image of high luminance using the uniform light of high quality.

The liquid crystal panel 110 and the backlight unit 120 are modularized with the main frame 130, the top frame 140, the bottom frame 150, optical guide frame 160 and the reinforcing frame 200.

The top frame 140 has a rectangular ring shape having a cross-sectional shape of "L" to cover a front edge surface and a side surface of the liquid crystal panel 110. For example, the top frame 140 may include a first top part 141 covering the side surface of the liquid crystal panel 110 and a second top part 143 covering the front edge surface of the liquid crystal panel 110 and perpendicularly extending from the first top part 141. The liquid crystal panel 110 is exposed through the top frame 140 to display an image, and the top frame 140 has a curved shape with a curvature corresponding to the predetermined curvature of the liquid crystal panel 110.

The optical guide frame 160 has a rectangular ring shape surrounding an edge portion of the optical sheets 121 of the backlight unit 120. The optical guide frame 160 may include a protrusion 161 (of FIG. 4) for fixing the optical sheets 121 and an inserting groove 121a (of FIG. 4) corresponding to the protrusion 161 along the edge portion of the optical sheets 121.

The main frame 130 has a rectangular ring shape to support a rear edge surface of the liquid crystal panel 110 and surround an edge portion of the backlight unit 120 including the optical sheets 121 surrounded by the optical guide frame 160. For example, the main frame 130 may include a first main part 131 surrounding a side surface of the optical guide frame 160 and the backlight unit 120 and a second main part 133 dividing positions of the liquid crystal panel 110 and the backlight unit 120 and perpendicularly extending from the first main part 131. The liquid crystal panel 110 may be attached and fixed to the second main part 133 through an adhesive pad (not shown) such as a double-sided adhesive tape. The main frame 130 has a curved shape with a curvature corresponding to the predetermined curvature of the liquid crystal panel 110.

The bottom frame 150 has a plate shape to support the liquid crystal panel 110 and the backlight unit 120. The bottom frame 150 may function as a basis for the assembly of the curved LCD device 100.

The reinforcing frame 200 includes a pair of curved reinforcing bars 210 disposed along a longitudinal direction of the curved LCD device 100 and a pair of side bars 220 and at least one center bar 230 disposed perpendicularly to the pair of reinforcing bars 210.

The pair of reinforcing bars 210 have a bar shape corresponding to a longitudinal direction of the bottom frame 150. For example, the pair of reinforcing bars 210 may be disposed at both long sides of the bottom frame 150 and spaced apart from each other. The pair of reinforcing bars 210 have a curved shape with a curvature corresponding to the predetermined curvature of the liquid crystal panel 110.

The pair of side bars 220 have a bar shape corresponding to a direction perpendicular to the longitudinal direction of the bottom frame 150. For example, the pair of side bars 220 may be disposed at both short sides of the bottom frame 150 and spaced apart from each other. The pair of side pars 220 may connect both ends of the pair of reinforcing bars 210.

The at least one center bar 230 may be disposed perpendicularly to the pair of reinforcing bars 210. The at least one center bar 230 may correspond to a central portion of the pair of reinforcing bars 210 to support a central portion of the bottom frame 150.

The main frame 130, the bottom frame 150, the optical guide frame 160, the top frame 140 and the reinforcing frame 200 are combined with one another to modularize the liquid crystal panel 110 and the backlight unit 120. The main frame 130 may support the liquid crystal panel 110 and surround the edge portion of the backlight unit 120 including the optical guide frame 160 surrounding the edge portion of the optical sheets 121. The pair of reinforcing bars 210 and the pair of side bars 220 of the reinforcing frame 200 may constitute side surfaces of the bottom frame 150. The top frame 140 may surround the front surface and the side surface of the liquid crystal panel 110. The bottom frame 150 may cover the rear surface of the backlight unit 120.

The top frame 140 may be referred to as a top cover, a case top or a top case, and the main frame 130 may be referred to as a guide panel, a support main, a main supporter or a mold frame. The bottom frame 150 may be referred to as cover bottom, a bottom cover or a lower cover.

In the curved LCD device 100, each reinforcing bar 210 has a stepped shape. As a result, the PCB 117 may contact a rear surface of a stepped portion of the pair of reinforcing bars 210 by folding the connecting member 116 even when the connecting member 116 has a relatively short length. In addition, even when the curved LCD device 100 has an edge type backlight unit, the same connecting member 116 having a relatively short length may be used for connecting the liquid crystal panel 110 and the PCB 117. As a result, fabrication cost can be reduced and fabrication efficiency can be improved. Further, since a light leakage at an edge portion of the liquid crystal panel 110 can be reduced or prevented, the curved LCD device 100 can display images of high quality.

Figure 3:
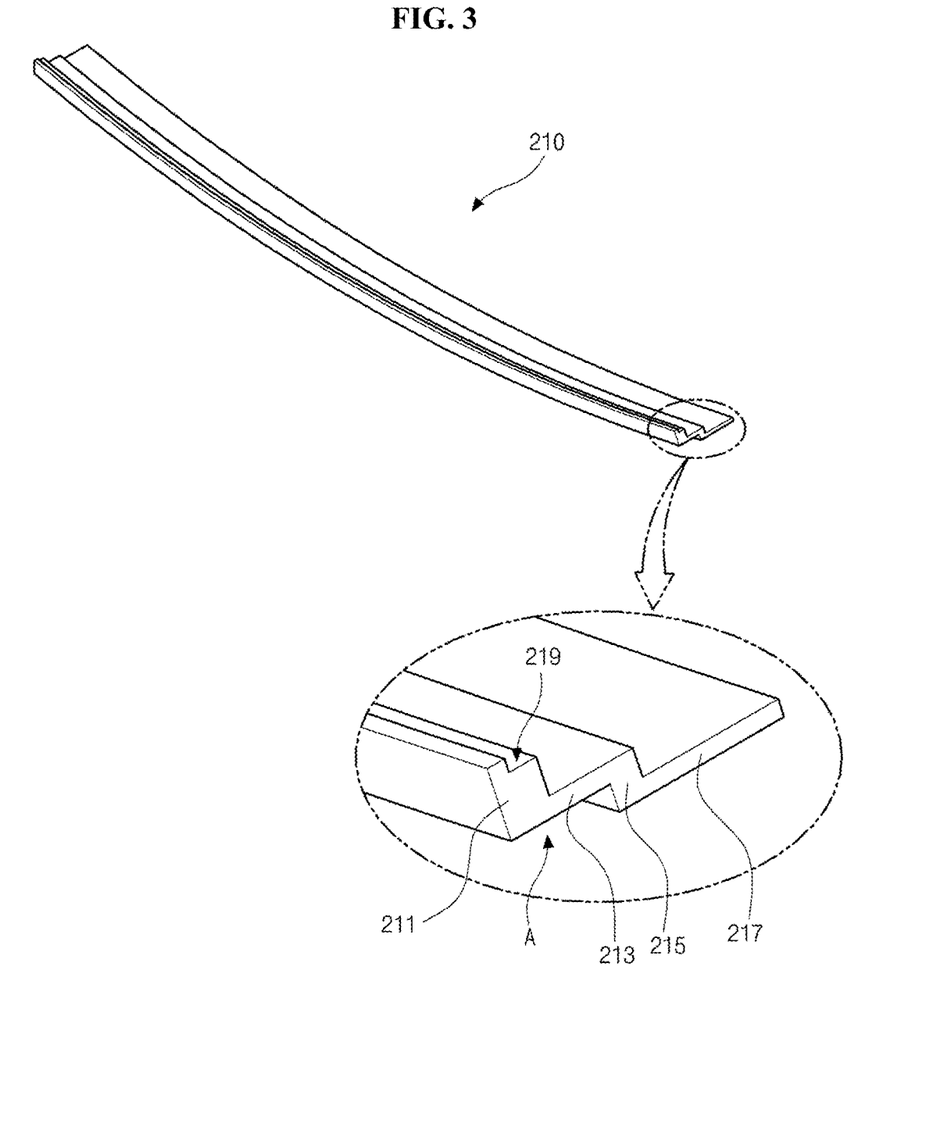
FIG. 3 is a perspective view illustrating a reinforcing bar of a reinforcing frame according to one embodiment of the present invention.

FIG. 3 is a perspective view illustrating a reinforcing bar of a reinforcing frame according to one embodiment of the present disclosure.

In FIG. 3, the reinforcing bar 210 of the reinforcing frame 200 (of FIG. 2) functions to maintain a curvature of the curved LCD device 100 (of FIG. 2). The reinforcing bar 210 may have a curved shape with a curvature corresponding to the predetermined curvature of the liquid crystal panel 110 (of FIG. 2). For example, the reinforcing bar 210 may include a metallic material having a relatively high rigidity such as aluminum (Al), stainless steel (SUS), hot dip galvanized iron (HGI) and electrolytically galvanized iron (EGI).

The reinforcing bar 210 may have a bar shape corresponding to a longitudinal direction of the bottom frame 150 (of FIG. 2). For example, the reinforcing bar 210 may include a first vertical part 211, a first horizontal part 213 perpendicularly bent from an end of the first vertical part 211, a second vertical part 215 perpendicularly bent from an end of the first horizontal part 213 and a second horizontal part 217 perpendicularly bent from an end of the second vertical part 215. As a result, the reinforcing bar 210 has a stepped shape where the first and second vertical parts 211 and 215 are spaced apart from each other in a cross-sectional view. The first vertical part 211 may have a guide portion 219 on a top surface thereof to support the edge portion of the diffusing plate 123 (of FIG. 2).

The pair of reinforcing bars 210 may be disposed along both long sides of the bottom frame 150 and spaced apart from each other. As a result, the pair of reinforcing bars 210 may have a stepped shape along an opposing direction to supply space for the PCB 117. Since the first and second vertical parts 211 and 215 and the first and second horizontal parts 213 and 217 have a uniform thickness, the first and second vertical parts 211 and 215 and the first and second horizontal parts 213 and 217 supply space for the PCB 117 under the rear surface of the reinforcing bar 210 with a relatively high rigidity.

Since the first horizontal part 213 is perpendicularly bent from an end of the first vertical part 211 and the second vertical part 215 is perpendicularly bent from an end of the first horizontal part 213, a rear surface of the first horizontal part 213 and an outer side surface of the second vertical part 215 constitute a step difference A. The PCB 117 connected to the liquid crystal panel 110 through the connecting member 116 is inserted into the space created by the step difference A and is disposed to contact the rear surface of the reinforcing bar 210 by folding the connecting member 116.

Since a distance between the front surface of the liquid crystal panel 110 and the rear surface of the first horizontal part 213 of the reinforcing bar 210 is smaller than a distance between the front surface of the liquid crystal panel 110 and the rear surface of the second horizontal part 217 of the reinforcing bar 210, the PCB 117 connected to the liquid crystal panel 110 through the connecting member 116 may be disposed to contact the rear surface of the curved LCD device 100 by folding the connecting member 116 even when the connecting member 116 has a relatively short length.

As a result, although a thickness of the curved LCD device 100 having a direct type backlight unit 120 (of FIG. 2) is greater than a thickness of a curved LCD device (not shown) having an edge type backlight unit, the connecting member 116, which connects the liquid crystal panel 110 and the PCB 117, can be used for both the curved LCD device 100 having a direct type backlight unit 120 and the curved LCD device having an edge type backlight unit. Thus, fabrication cost can be reduced and fabrication efficiency can be improved.

Figure 4:
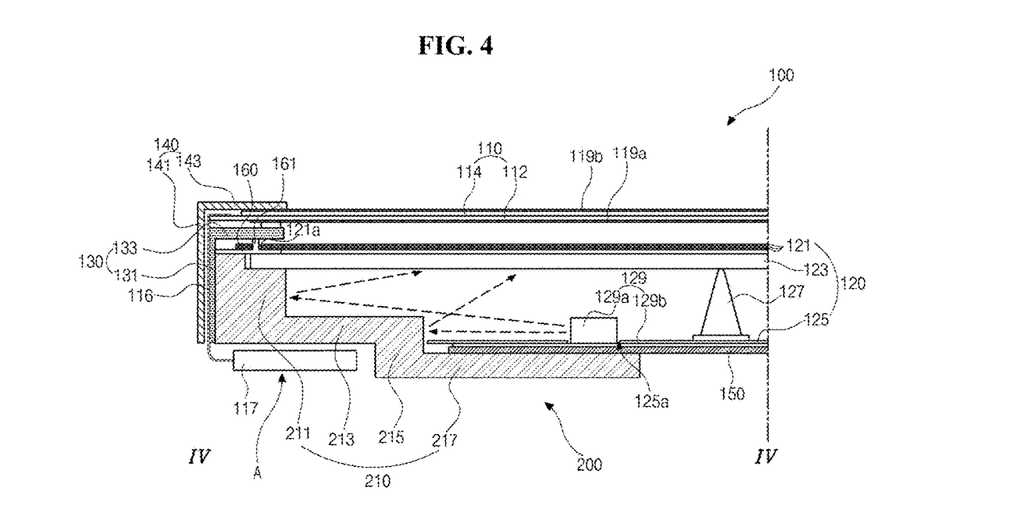
FIG. 4 is a cross-sectional view taken along line IV-IV of FIG. 2.

FIG. 4 is a cross-sectional view taken along line IV-IV of FIG. 2.

In FIG. 4, the backlight unit 120 (of FIG. 2) includes the LED assembly 129, the reflecting plate 125, the diffusing plate 123 and the optical sheets 121. The LED assembly 129 includes the LED PCB 129b and the plurality of LEDs 129a on the LED PCB 129b, and the reflecting plate 125 exposes the plurality of LEDs 129a through the plurality of through holes 125a. The diffusing plate 123 and the optical sheets 121 are sequentially disposed over the LED assembly 129.

The liquid crystal panel 110 is disposed over the backlight unit 120. The liquid crystal panel 110 includes the first and second substrates 112 and 114 and the liquid crystal layer (not shown) between the first and second substrates 112 and 114, and the upper and lower polarizing plates 119a and 119b for selectively transmitting a predetermined polarized light are formed on the outer surfaces of the upper and lower substrates 112 and 114, respectively.

The backlight unit 120 and the liquid crystal panel 110 are modularized by the main frame 130, the top frame 140, the bottom frame 150, the optical guide frame 160 and the reinforcing frame 200.

The LED assembly 129 is disposed on the bottom frame 150, and the reflecting plate 125 is disposed on the LED assembly 129 such that the plurality of LEDs 129a are exposed through the plurality of through holes 125a and the LED PCB 129b is covered with the reflecting plate 125. The diffusing plate 123 is disposed over the LED assembly 129 and the reflecting plate 125. The diffusing plate 123 is supported by the guide supporter 127 to be spaced apart from the LED assembly 129 and the reflecting plate 125. The optical sheets 121 are disposed over the diffusing plate 123 and the edge portion of the optical sheets 121 is surrounded by the optical guide frame 160.

The side surface of the backlight unit 120 including the LED assembly 129, the reflecting plate 125, the diffusing plate 123 and the optical sheets 121 is surrounded by the first main part 131 of the main frame 130, and the rear edge surface of the liquid crystal panel 110 is supported by the second main part 133 such that the liquid crystal panel 110 is disposed over the optical sheets 121.

The front edge surface and the side surface of the liquid crystal panel 110 are surrounded by the top frame 140. The top frame 140 and the main frame 130 are assembled and combined with each other such that an inner surface of the first top part 141 of the top frame 140 contacts an outer surface of the first main part 131 of the main frame 130.

The pair of reinforcing bars 210 of the reinforcing frame 200 constitute side surfaces of the bottom frame 150 such that the first vertical parts 211 of the pair of the reinforcing bars 210 are disposed along both the long sides of the bottom frame 150, and the bottom frame 150 is disposed on and supported by the second horizontal parts 217 of the pair of reinforcing bars 210. The bottom frame 150 and the pair of reinforcing bars 210 are assembled and combined with each other such that the rear surface of the bottom frame 150 contacts the front surface of the second horizontal parts 217 of the pair of reinforcing bars 210. In addition, the main frame 130 and the pair of reinforcing bars 210 are assembled and combined with each other such that an outer surface of the first vertical parts 211 of the pair of reinforcing bars 210 contact an inner surface of the first main part 131 of the main frame 130.

Thus, the bottom frame 150 is assembled and combined with the pair of reinforcing bars 210 of the reinforcing frame 200, and the pair of reinforcing bars 210 of the reinforcing frame 200 are assembled and combined with the main frame 130. Further, the main frame 130 surrounding the optical guide frame 160 is assembled and combined with the top frame 140. Accordingly, the liquid crystal panel 110 and the backlight unit 120 are modularized and integrated by the main frame 130, the top frame 140, the bottom frame 150, the optical guide frame 160 and the reinforcing frame 200.

Here, the guide portion 219 having a concave shape where an edge is removed may be formed on the top surface of the first vertical part 211 of the reinforcing bar 210 to support the edge portion of the diffusing plate 123.

The PCB 117 connected to the liquid crystal panel 110 through the connecting member 116 may contact the rear surface of one of the pair of reinforcing bars 210 by folding the connecting member 116. The pair of reinforcing bars 210 have a stepped shape such that the rear surface of the first horizontal part 213 and the outer side surface of the second vertical part 215 constitute a step difference A, and the PCB 117 is inserted into the space created by the step difference A to contact the rear surface of the reinforcing bar 210 by folding the connecting member 116. Accordingly, the PCB 117 connected to the liquid crystal panel 110 through the connecting member 116 may be disposed to contact the rear surface of the reinforcing bar 210 of the curved LCD device 100 by folding the connecting member 116 even when the connecting member 116 has a relatively short length.

As a result, although a thickness of the curved LCD device 100 having a direct type backlight unit 120 (of FIG. 2) is greater than a thickness of a curved LCD device having an edge type backlight unit (not shown), the connecting member 116, which connects the liquid crystal panel 110 and the PCB 117, can be used for both the curved LCD device 100 having a direct type backlight unit 120 and the curved LCD device having an edge type backlight unit. Thus, fabrication cost can be reduced and fabrication efficiency can be improved.

In addition, since the pair of reinforcing bars 210 have a uniform thickness, the reinforcing frame 200 may maintain a whole curvature of the curved LCD device 100 with a relatively high rigidity.

Moreover, since the pair of reinforcing bars 210 have a stepped shape, a light leakage at an edge portion of the liquid crystal panel 110 may be reduced or prevented. A partial light emitted from the plurality of LEDs 129a of the LED assembly 129 is reflected on the pair of reinforcing bars 210 and propagates toward the diffusing plate 123. Since the pair of reinforcing bars 210 have vertical reflecting surfaces such as inner surfaces of the first and second vertical parts 211 and 215, the partial light is reflected on the vertical reflecting surface toward a central portion of the diffusing plate 123. As a result, the partial light is not reflected toward an edge portion of the diffusing plate 123 as compared to the LCD device according to the related art, and a light leakage at the edge portion can thus be reduced or prevented.

Figure 5A:
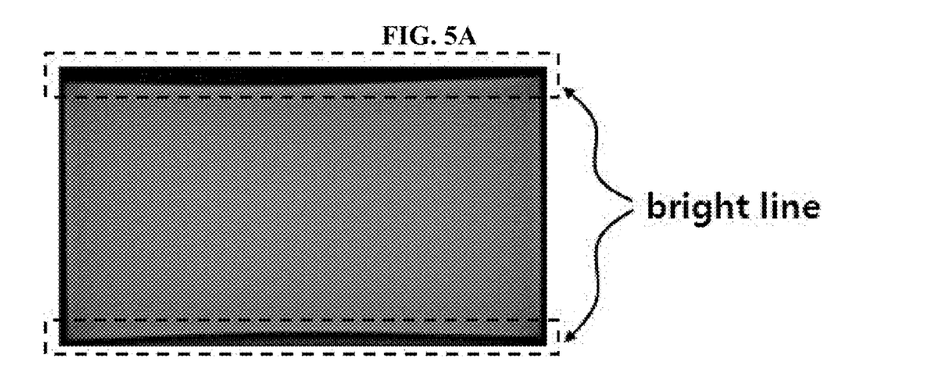
FIG. 5A is a photograph showing a curved liquid crystal display device of a comparison example that has a light leakage at an edge portion.
Figure 5B:
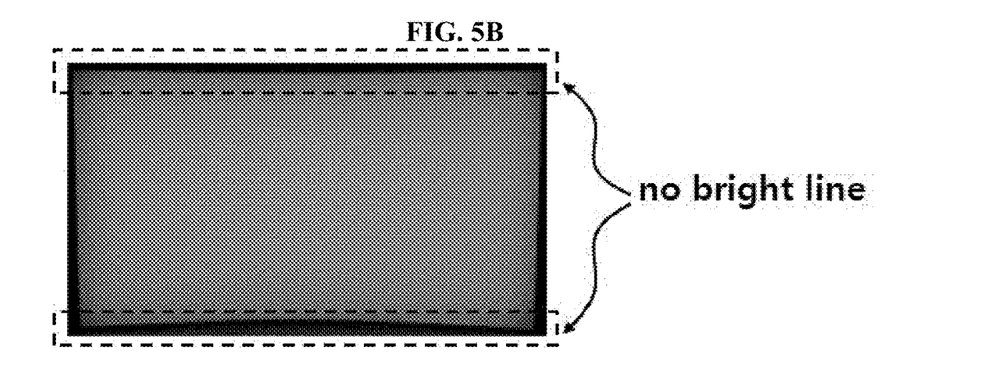
FIG. 5B is a photograph showing a curved liquid crystal display device according to one embodiment of the present invention that has substantially no light leakage at an edge portion.

FIG. 5A is a photograph showing a curved LCD device of a comparison example that has a light leakage at an edge portion, and FIG. 5B is a photograph showing a curved LCD device according to one embodiment of the present invention that has substantially no light leakage at an edge portion.

While the curved LCD device of FIG. 5A has a bright line due to a light leakage at an edge portion of the liquid crystal panel, the curved LCD device 100 of FIG. 5B does not have such a bright line at an edge portion of the liquid crystal panel 110.

In the curved LCD device 100 according to one embodiment of the present invention, since the pair of reinforcing bars 210 have a stepped shape having the vertical reflecting surface, the partial light emitted from the plurality of LEDs 129a is reflected on the vertical reflecting surface toward a central portion of the diffusing plate 123. As a result, light is substantially not emitted from the edge portion of the diffusing plate 123 corresponding to the long sides of the bottom frame 150, and a light leakage due to the light supplied from the edge portion without passing through the optical sheets 121 to the liquid crystal panel 110 can be reduced or prevented.

When the pair of reinforcing bars 210 are formed of aluminum (Al), an additional reflecting member may not be required on the reflecting surface of the pair of reinforcing bars 210. When the pair of reinforcing bars 210 are formed of one of stainless steel (SUS), hot dip galvanized iron (HGI) and electrolytically galvanized iron (EGI), a reflecting pad (not shown) of a white color or silver color may be formed on the reflecting surface of the pair of reinforcing bars 210.

In the curved LCD device 100, a side mold 240 (of FIG. 6) may be formed on the pair of side bars 220 (of FIG. 2) corresponding to the short sides of the bottom frame 150 such that the reinforcing frame 200 has a stepped shape along the short sides of the bottom frame 150.

Figure 6:
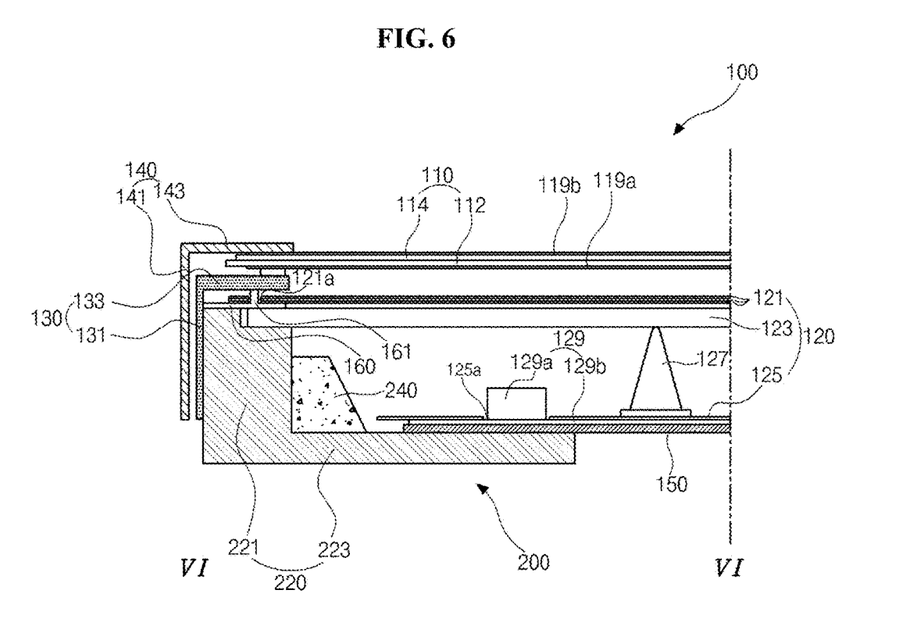
FIG. 6 is a cross-sectional view taken along line VI-VI of FIG. 2.

FIG. 6 is a cross-sectional view taken along line VI-VI of FIG. 2.

In FIG. 6, the pair of side bars 220 have a bar shape having a cross-sectional shape of "L." For example, the pair of side bars 220 may include a third vertical part 221 and a third horizontal part 223 perpendicularly bent from an end of the third vertical part 221. The pair of side bars 220 are disposed along both the short sides of the bottom frame 150 and spaced apart from each other such that the third vertical part 221 constitutes side surfaces of the bottom frame 150. In addition, the bottom frame 150 is disposed and supported by the third horizontal part 223 of the pair of side bars 220.

Here, a side mold 240 is disposed on inner surfaces of the third vertical part 221 and the third horizontal part 223 of each bar 220. As a result, the side bar 220 may have a stepped shape by external surfaces of the third vertical part 221, the side mold 240 and the third horizontal part 223 in a cross-sectional view. For reflecting light, the side mold 240 may include a high glossy white material or the side mold 240 may be treated to have a mirror surface. Accordingly, a light leakage along the short sides of the liquid crystal panel 110 may also be reduced or prevented in the curved LCD device 100.

Figure 7:
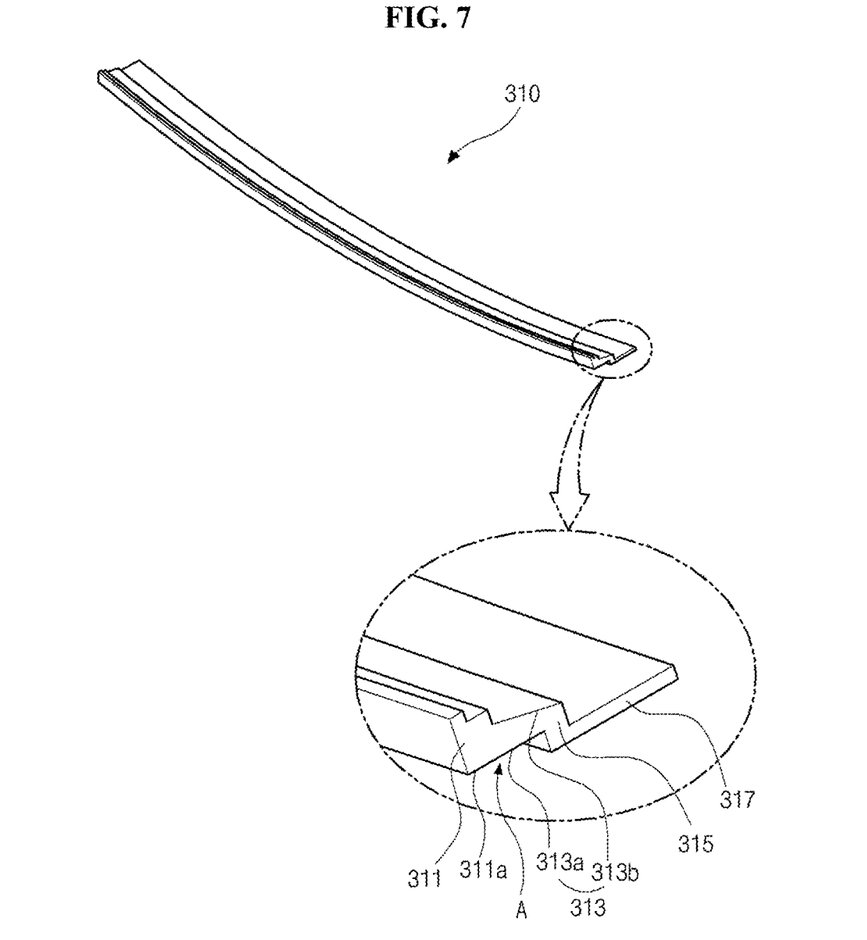
FIG. 7 is a perspective view illustrating a reinforcing bar of a reinforcing frame according to one embodiment of the present disclosure.
Figure 8:
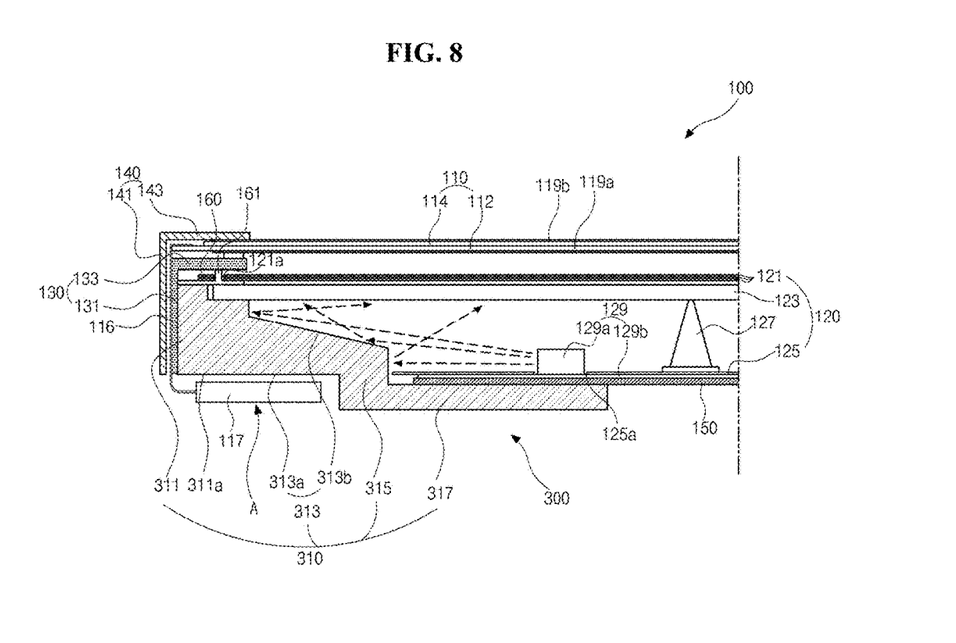
FIG. 8 is a cross-sectional view illustrating a curved liquid crystal display device according to one embodiment of the present disclosure.

FIG. 7 is a perspective view illustrating a reinforcing bar of a reinforcing frame according to one embodiment of the present invention, and FIG. 8 is a cross-sectional view illustrating a curved liquid crystal display device according to one embodiment of the present disclosure.

In FIG. 7, a reinforcing bar 310 of a reinforcing frame 300 (of FIG. 8) according to one embodiment of the present invention functions to maintain a curvature of a curved liquid crystal display (LCD) device 100 (of FIG. 8). The reinforcing bar 310 may have a curved shape with a curvature corresponding to a predetermined curvature of the liquid crystal panel 110 (of FIG. 8). For example, the reinforcing bar 310 may include a metallic material having a relatively high rigidity such as aluminum (Al), stainless steel (SUS), hot dip galvanized iron (HGI) and electrolytically galvanized iron (EGI).

The reinforcing bar 310 may have a bar shape corresponding to a longitudinal direction of a bottom frame 150 (of FIG. 8). For example, the reinforcing bar 310 may include a first vertical part 311, a slanting part 313 extending from an end of the first vertical part 311, a second vertical part 315 extending from an end of the slanting part 313 and a horizontal part 317 perpendicularly bent from an end of the second vertical part 315.

The first vertical part 311 may include a first lower surface 311a and an inner surface. The slanting part 313 may include a second lower surface 313a extending from the first lower surface 311a of the first vertical part 311 and a slanting surface 313b protruding from the inner surface of the first vertical part 311 and slanting toward the second lower surface 313a such that a thickness of the slanting part 313 becomes smaller from the first vertical part 311 to the second vertical part 315. As a result, the reinforcing bar 310 has a stepped shape where the first and second vertical parts 311 and 315 are spaced apart from each other and are connected to each other through the slanting surface 313b in a cross-sectional view. The first vertical part 311 may have a guide portion on a top surface thereof to support an edge portion of a diffusing plate 123 (of FIG. 8).

The pair of reinforcing bars 310 may be disposed along both long sides of the bottom frame 150 and spaced apart from each other. As a result, the pair of reinforcing bars 310 may have a stepped shape along an opposing direction to supply space for a printed circuit board (PCB) 117 (of FIG. 8). Since the first and second vertical parts 311 and 315, the slanting part 313 and the horizontal parts 317 have a uniform thickness, the first and second vertical parts 311 and 315, the slanting part 313 and the horizontal part 317 supply space for the PCB 117 under the rear surface of the reinforcing bar 310 with a relatively high rigidity.

Since the second lower surface 313a of the slanting part 313 extends from the first lower surface 311a of the first vertical part 311 and the second vertical part 315 is perpendicularly bent from an end of the slanting part 313, the first lower surface 311a of the first vertical part 311, the second lower surface 313a of the slanting part 313 and an outer side surface of the second vertical part 315 constitute a step difference A. The PCB 117 connected to the liquid crystal panel 110 through a connecting member 116 (of FIG. 8) is inserted into the space created by the step difference A and is disposed to contact the rear surface of the reinforcing bar 310 by folding the connecting member 116.

Since a distance between a front surface of the liquid crystal panel 110 and the second lower surface 313b of the slanting part 313 of the reinforcing bar 310 is smaller than a distance between the front surface of the liquid crystal panel 110 and a rear surface of the horizontal part 317 of the reinforcing bar 310, the PCB 117 connected to the liquid crystal panel 110 through the connecting member 116 may be disposed to contact the rear surface of the curved LCD device 100 by folding the connecting member 116 even when the connecting member 116 has a relatively short length.

As a result, although a thickness of the curved LCD device 100 having a direct type backlight unit 120 is greater than a thickness of a curved LCD device having an edge type backlight unit (not shown), the connecting member 116, which connects the liquid crystal panel 110 and the PCB 117, can be used for both the curved LCD device 100 having a direct type backlight unit 120 and the curved LCD device having an edge type backlight unit. Thus, fabrication cost can be reduced and fabrication efficiency can be improved.

In addition, since the pair of reinforcing bars 310 have a uniform thickness, the reinforcing frame 300 including the pair of reinforcing bars 310 may maintain a whole curvature of the curved LCD device 100 with a relatively high rigidity.

Moreover, since the pair of reinforcing bars 310 have a stepped shape, a light leakage at an edge portion of the liquid crystal panel 110 may be reduced or prevented.

Although not shown in FIG. 8, the curved LCD device 100 according to one embodiment of the present invention may have the same structure as the curved LCD device 100 according to one embodiment of the present invention except the reinforcing frame 300. For example, the curved LCD device 100 according to one embodiment of the present invention may include a liquid crystal panel 110, a backlight unit 120, a main frame 130, a top frame 140, a bottom frame 150, an optical guide frame 160 and a reinforcing frame 300.

In FIG. 8, a partial light emitted from a plurality of light emitting diodes (LEDs) 129a of an LED assembly 129 is reflected on the pair of reinforcing bars 310 and propagates toward the diffusing plate 123. Since the pair of reinforcing bars 310 has a slanting reflecting surface such as the slanting surface 313b of the slanting part 313 as well as a vertical reflecting surface such as inner surfaces of the first and second vertical parts 311 and 315, the partial light is reflected on the slating reflecting surface toward a portion inside an edge of the diffusing plate 123 and is reflected on the vertical reflecting surface toward a central portion of the diffusing plate 123. As a result, the partial light is not reflected toward the edge of the diffusing plate 123 as compared to the LCD device according to the related art, and is reflected toward a larger portion of the diffusing plate 123. Accordingly, a light leakage at the edge portion can be reduced or prevented, and the light emitted through the diffusing plate 123 has a higher luminance at a portion inside the edge of the diffusing plate 123.

When the pair of reinforcing bars 310 are formed of aluminum (Al), an additional reflecting member may not be required on the reflecting surface of the pair of reinforcing bars 310. When the pair of reinforcing bars 310 are formed of one of stainless steel (SUS), hot dip galvanized iron (HGI) and electrolytically galvanized iron (EGI), a reflecting pad (not shown) of a white color or silver color may be formed on the reflecting surface of the pair of reinforcing bars 310.

Figure 9:
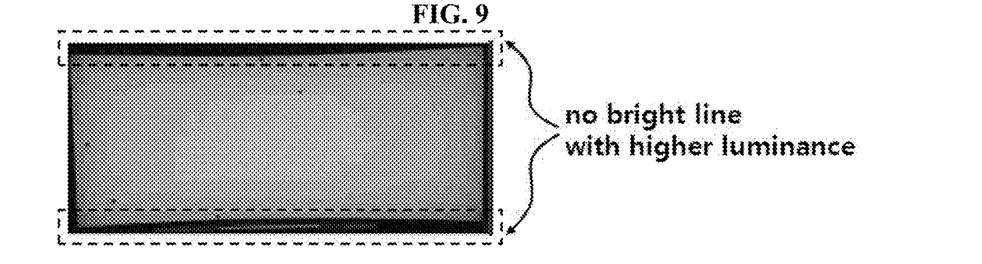
FIG. 9 is a photograph showing a curved liquid crystal display device according to one embodiment of the present disclosure that has substantially no light leakage at an edge portion.

FIG. 9 is a photograph showing a curved liquid crystal display device according to one embodiment of the present disclosure that has substantially no light leakage at an edge portion.

While the curved LCD device of FIG. 5A has a bright line due to a light leakage at an edge portion of the liquid crystal panel, the curved LCD device 100 of FIG. 8 according to one embodiment of the present disclosure does not have such a bright line at an edge portion of the liquid crystal panel 110, as shown in FIG. 9.

In the curved LCD device 100 according to one embodiment of the present invention, since the pair of reinforcing bars 310 (of FIG. 8) have a stepped shape having the slanting reflecting surface and the vertical reflecting surface, the partial light emitted from the plurality of LEDs 129a (of FIG. 8) is reflected on the slating reflecting surface toward a portion inside an edge of the diffusing plate 123 (of FIG. 8) and is reflected on the vertical reflecting surface toward a central portion of the diffusing plate 123. As a result, light is substantially not emitted from the edge portion of the diffusing plate 123 corresponding to the long sides of the bottom frame 150 (of FIG. 8), and is reflected toward a larger portion of the diffusing plate 123. Since the light from the edge portion without passing through the optical sheets 121 (of FIG. 8) is substantially not supplied to the liquid crystal panel 110, a light leakage can be reduced or prevented. Further, since light is incident on a larger portion of the diffusing plate 123, luminance and uniformity of the light emitted from the diffusing plate 123 can be improved.

As a result, in the curved LCD device according to first and second embodiments of the present invention, the pair of reinforcing bars have a stepped shape such that the rear surface of the first horizontal part (or the slanting part) and the outer side surface of the second vertical part constitute a step difference, and the PCB is inserted into the space created by the step difference to contact the rear surface of the reinforcing bar by folding the connecting member. Since the connecting member, which connects the liquid crystal panel and the PCB, can be used for both the curved LCD device having a direct type backlight unit and the curved LCD device having an edge type backlight unit, fabrication cost can be reduced and fabrication efficiency can be improved.

In addition, since the pair of reinforcing bars have a uniform thickness, the reinforcing frame maintains a whole curvature of the curved LCD device with a relatively high rigidity. Further, since the pair of reinforcing bars have a stepped shape, a light leakage at an edge portion of the liquid crystal panel can be reduced or prevented.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A curved display device comprising:
   a display panel having a curvature between a top frame and a bottom frame;
   a printed circuit board (PCB) electrically connected to at least one edge portion of the display panel where driving circuits and signal lines are provided through a connector; and
   a reinforcing frame that supports a rear surface of the bottom frame, the reinforcing frame including a reinforcing bar,
   wherein the reinforcing bar has a step to include first and second rear surfaces that are curved to substantially follow the curvature of the display panel, with the first rear surface being closer to the display panel than the second rear surface, wherein the PCB is mounted on the first rear surface of the reinforcing bar, and
   wherein the reinforcing bar comprises a first vertical part, a first horizontal part extending from an end of the first vertical part to a start of a second vertical part, the second vertical part extending from an end of the first horizontal part to a start of a second horizontal part, and the second horizontal part extending from an end of the second vertical part, such that the first and second horizontal parts extend from the first and second vertical parts, respectively, in the same direction.

2. The curved display device of claim 1, wherein the connector is a flexible printed circuit (FPC) and folded along a side surface of the reinforcing frame.

3. The curved display device of claim 1, wherein the reinforcing bar includes one of aluminum (Al), stainless steel (SUS), hot dip galvanized iron (HGI) and electrolytically galvanized iron (EGI).

4. The curved display device of claim 1, wherein the reinforcing frame further includes another reinforcing bar such that a pair of reinforcing bars are spaced apart from each other and disposed along a longitudinal direction of the bottom frame, substantially following the curvature of the display panel.

5. The curved display device of claim 4, wherein the reinforcing frame further includes a pair of side bars that are spaced apart from each other and disposed along short sides of the bottom frame.

6. The curved display device of claim 1, wherein the first rear surface of the reinforcing bar is a rear surface of the first horizontal part, and the second rear surface of the reinforcing bar is a rear surface of the second horizontal part.

7. The curved display device of claim 1, further comprising a backlight unit between the display panel and the bottom frame,
   wherein the display panel is a liquid crystal panel.

8. The curved display device of claim 7, wherein the backlight unit is either a direct type backlight unit or an edge type backlight unit.

9. The curved display device of claim 7, wherein the reinforcing bar has an inner surface in a substantially vertical direction that reflects a light emitted from the backlight unit toward a center portion of the liquid crystal panel.

10. The curved display device of claim 9, wherein the reinforcing bar further includes a slanted inner surface.

11. The curved display device of claim 9, further comprising a reflecting pad of a white or silver color on the inner surface of the reinforcing bar.

12. The curved display device of claim 7, further comprising a main frame that supports a rear surface of the liquid crystal panel and borders an edge portion of the backlight unit.

13. The curved display device of claim 5, further comprising a side mold on an inner surface of the pair of side bars,
   wherein the side mold includes a high glossy white material or has a mirror surface.

14. The curved display device of claim 1, further comprising a backlight unit between the display panel and the bottom frame, wherein the backlight unit includes a diffusion sheet,
   Wherein the first vertical part has a guide portion that supports an edge portion of the diffusion sheet.

15. The curved display device of claim 1, further comprising at least one center bar disposed perpendicularly to the reinforcing bar.

16. A liquid crystal display (LCD) module comprising:
   an LCD panel between a top frame and a bottom frame, wherein the LCD panel has a curvature alone its longitudinal direction;
   a printed circuit board (PCB) electrically connected to a plurality of driving ICs of the LCD panel through a foldable connector; and
   a pair of reinforcing bars spaced apart from each other, disposed along a longitudinal direction of the bottom frame and supporting a rear surface of the bottom frame,
   wherein the pair of reinforcing bars are curved substantially to follow the curvature of the LCD panel; and
   wherein at least one of the pair of reinforcing bars has a step to include first and second rear surfaces that extend along the bottom frame in the longitudinal direction of the bottom frame, with the first rear surface being closer to the LCD panel than the second rear surface, wherein the PCB is mounted on the first rear surface of the at least one of the pair of reinforcing bars, and
   wherein at least one of the pair of reinforcing bars comprises a first vertical part, a first horizontal part extending from an end of the first vertical part to a start of a second vertical part, the second vertical part extending from an end of the first horizontal part to a start of a second horizontal part, and the second horizontal part extending from an end of the second vertical part, such that the first and second horizontal parts extend from the first and second vertical parts, respectively, in the same direction.

17. The LCD module of claim 16, further comprising a backlight unit between the LCD panel and the bottom frame, wherein the at least one of the pair of reinforcing bars has an inner surface in a substantially vertical direction that reflects a light emitted from the backlight unit toward a center portion of the LCD panel.

18. The LCD module of claim 17, wherein the at least one of the pair of reinforcing bars includes a slanted inner surface.

19. The LCD module of claim 17, further comprising an optical sheet between the LCD panel and the backlight unit, wherein the at least one of the pair of reinforcing bars includes a guide portion that supports the optical sheet.

\* \* \* \* \*